United States Patent [19]
Tsui

[11] Patent Number: 5,371,038
[45] Date of Patent: Dec. 6, 1994

[54] METHOD OF FORMING A QUANTUM MULTI-FUNCTION SEMICONDUCTOR DEVICE

[75] Inventor: Raymond K. Tsui, Phoenix, Ariz.

[73] Assignee: Motorola, Inc., Schaumburg, Ill.

[21] Appl. No.: 139,180

[22] Filed: Oct. 21, 1993

[51] Int. Cl.$^5$ .............................................. H01L 21/20
[52] U.S. Cl. ...................................... 437/89; 437/228; 437/133; 257/14
[58] Field of Search ................... 437/89, 228, 105, 107, 437/110, 133; 148/DIG. 65, DIG. 160; 257/20, 14, 192

[56] References Cited

U.S. PATENT DOCUMENTS

| | | | |
|---|---|---|---|
| 4,948,751 | 8/1990 | Okamoto et al. | 148/DIG. 169 |
| 5,084,409 | 1/1992 | Beam, III et al. | 437/89 |
| 5,258,326 | 11/1993 | Morishima et al. | 437/105 |
| 5,278,929 | 12/1993 | Hirtz et al. | 437/89 |

OTHER PUBLICATIONS

Y. Katayama et al., "In Situ Electron-Beam Lithography for Nanofabrication of AlGaAs-GaAs Heterostructures," 1st International Workshop on Quantum Function Devices QFD '92, R&D Association for Future Electron Devices, May 13-15, 1992, pp. 12-13.

Primary Examiner—Olik Chaudhuri
Assistant Examiner—S. Mulpuri
Attorney, Agent, or Firm—Rennie William Dover

[57] ABSTRACT

The present invention is a method of forming a quantum multi-function semiconductor device. In the method of the present invention, an insulating layer (12) is formed on a semiconductor substrate (11). An opening (14) is formed in the insulating layer (12), and a channel region (15) is formed in the opening (14). A channel layer (21) is formed over the channel region (15). An opening (23) is formed through the channel layer (21) such that a portion of the opening is over a portion of the channel region (15). A source electrode (28) is formed to contact a channel layer (17) of the channel region (15), a drain electrode (29) is formed to contact the channel layer (21), and a gate electrode (31) is formed to contact the second barrier layer (27).

20 Claims, 5 Drawing Sheets

METHOD OF FORMING A QUANTUM MULTI-FUNCTION SEMICONDUCTOR DEVICE

FIELD OF THE INVENTION

The present invention relates, in general, to methods of forming semiconductor devices, and more particularly, to methods of forming quantum multi-function semiconductor devices.

BACKGROUND OF THE INVENTION

Semiconductor device manufacturers are constantly striving to shrink or scale device sizes. However, as scaling continues, quantum mechanical constraints will limit the minimum feature sizes of the semiconductor devices. Thus, semiconductor device manufacturers are seeking methods of exploiting the physical properties of the semiconductor material, i.e., manufacturing devices in accordance with their quantum mechanical properties. One such device type is a quantum multi-function device. These types of devices utilize quantum mechanical effects such as interband resonant tunneling and electrons confined in quantum box structures.

Since the superior electrical performance of these types of devices is largely due to their exploitation of quantum effects produced by the appropriate stacking together of a series of ultra-thin semiconductor layers with thicknesses of the order of tens of angstroms or less each, they are particularly sensitive to the presence of contaminants that arise during the various processing steps. For example, the accumulation of a mono-atomic layer of carbon at the interface between two of the ultra-thin layers may adversely affect the performance of the device. Device processing steps such as patterning and etching carried out in a conventional manner may introduce a sufficient number of contaminants to render these devices inoperative. Further, some process steps, e.g., patterning and etching are performed at one location within a fabrication facility, whereas other process steps, e.g., epitaxial growth, are performed at a different location within the fabrication facility. Typically the semiconductor substrates are exposed to air during their transport from one processing location to another. During the transport step, they are susceptible to contamination by particulates in the air.

Accordingly, it would be advantageous to have a method of fabricating quantum multi-function devices that eliminates contamination by air. It would be further advantageous for the method to include epitaxial re-growth steps that minimize the number of process steps that contaminate the devices.

SUMMARY OF THE INVENTION

A method of forming a quantum multi-function semiconductor device comprising the steps of providing a semiconductor substrate having an insulating layer disposed thereon, the insulating layer having a first opening, forming a channel region on the semiconductor substrate, the channel region being in the opening, forming a barrier layer over the channel region, forming a channel layer on the barrier layer, forming a second opening, the second opening over the channel region and extending through the channel layer, wherein a portion of the channel layer remains over the channel region, and contacting the first channel region with a first electrode and contacting the channel layer with a second electrode.

DETAILED DESCRIPTION OF THE DRAWINGS

Figure 1:
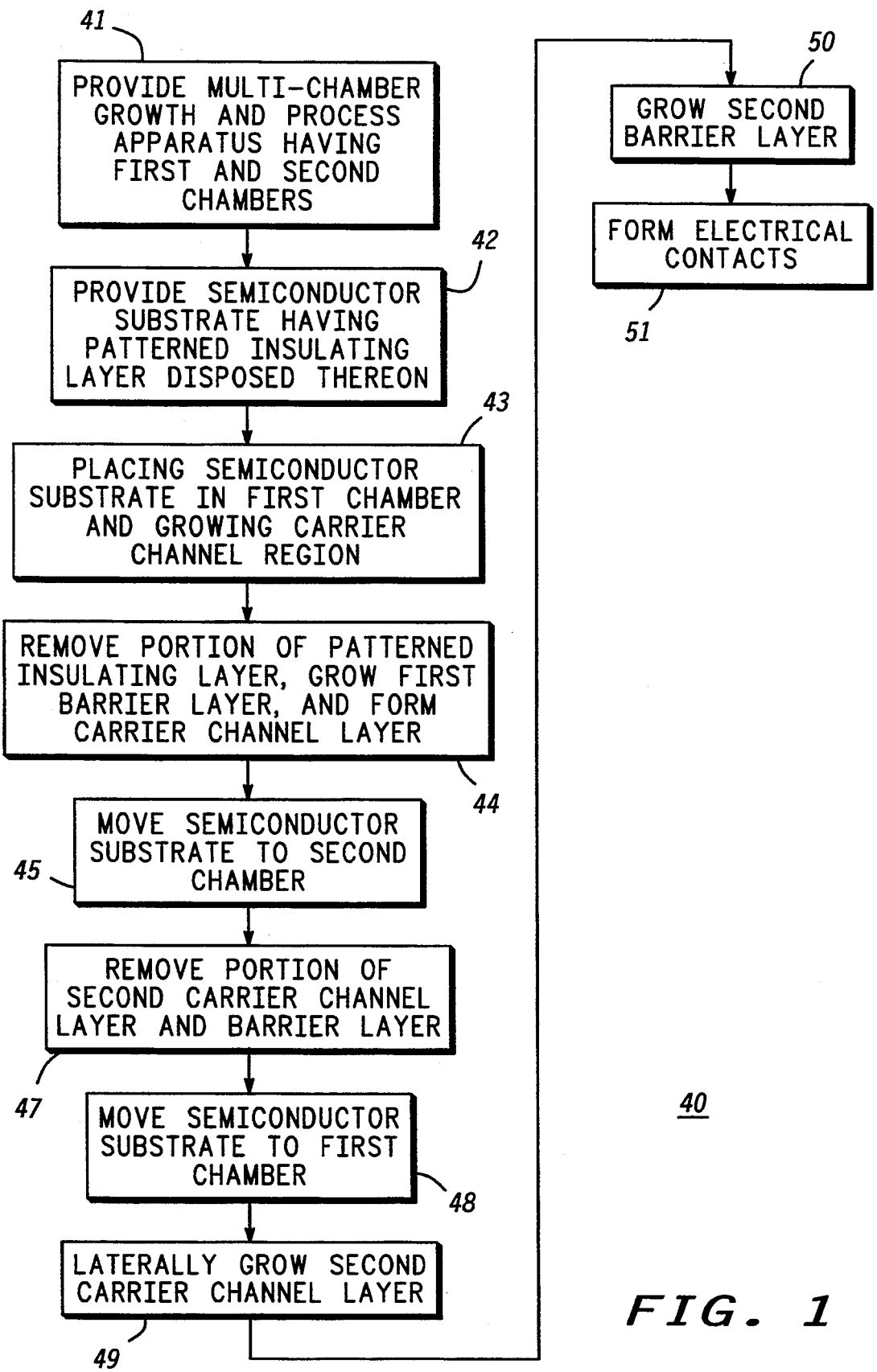
FIG. 1 illustrates a flow diagram in accordance with an embodiment of the present invention.

Generally, the present invention provides a method of fabricating quantum multi-function semiconductor devices. This is accomplished by fabricating the semiconductor devices in a multi-chamber growth and processing apparatus. FIG. 1 illustrates a flow diagram 40 in accordance with an embodiment of the present invention. It shall be understood that the same reference numerals are used in the figures to denote the same elements.

In a first step 41, a multi-chamber growth and process apparatus having first and second chambers is provided. A multi-chamber growth and process apparatus is a system that consists of a molecular beam epitaxy chamber and a patterning/etch chamber coupled together via an ultra-high vacuum connection. In addition, a semiconductor substrate having a patterned insulating layer formed thereon is provided (step 42). The semiconductor substrate is placed in the first chamber and a carrier channel region is formed (step 43). While in the first chamber, a portion of the patterned insulating layer is removed, a barrier layer is grown, and a carrier channel layer is formed (step 44).

The semiconductor substrate is moved to the second chamber (step 45) in which a portion of the carrier channel layer and a portion of the barrier layer are removed (step 47). The semiconductor substrate is moved back to the first chamber (step 48) and the carrier channel layer is extended using a lateral growth technique (step 49). Another barrier layer is grown on the carrier channel region and the carrier channel layer (step 50). Subsequently, electrical contacts are formed (step 51).

Although the multi-chamber growth and process apparatus has been described as having first and second chambers, it shall be understood that this is not a limitation of the present invention. In other words, the multi-chamber growth and process apparatus may have a single chamber or more than two chambers.

Figure 2:
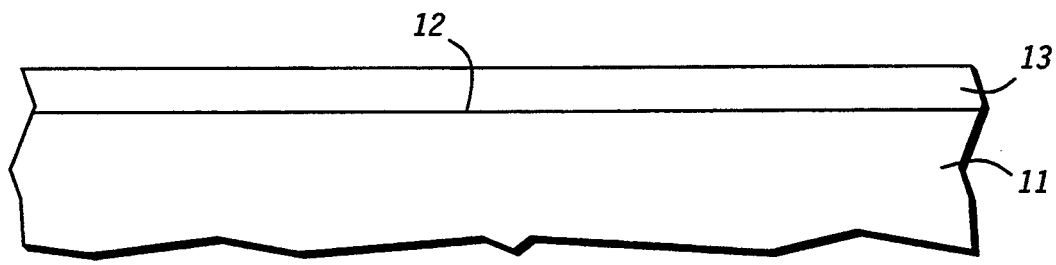
FIGS. 2-10 illustrate sequential cross-sectional views of a semiconductor device during various stages of manufacture in accordance with an embodiment of the present invention.

FIG. 2 illustrates a cross-sectional view of a portion 10 of a quantum multi-function semiconductor device comprising a substrate layer 11 having a major surface 12. A layer of insulating material 13 is formed on the major surface 12. Suitable materials for the substrate 11 include gallium arsenide and indium phosphide, whereas suitable materials for the layer of insulating material 13 include oxidized gallium arsenide and gallium oxide, with a final thickness of approximately 100 angstroms or less. Formation oil the layer of insulating material 13 on the major surface 12 is well known in the art and may be accomplished by oxidation in an oxygen-rich environment.

Figure 3:
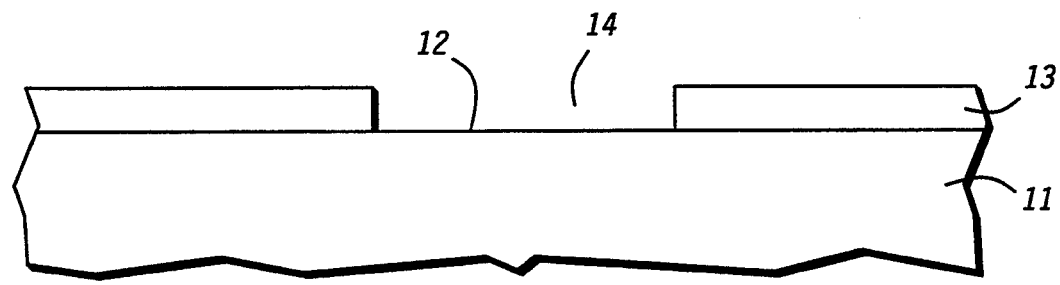

FIG. 3 illustrates the layer of insulating material 13 being patterned to have an opening 14 through which the major surface 12 is exposed. Formation of openings using a combination of lithographic and etch methods are well known to those skilled in the art.

Although not shown, it shall be understood that the steps describing FIGS. 4–10 are performed in the multi-chamber growth and processing apparatus. Now referring to FIG. 4, a conductive or channel region 15 is selectively formed in the opening 14, wherein the conductive region 15 comprises a layer of a material selected from the group consisting of group III–V compounds and group II–VI compounds. More particularly, the conductive region 15 comprises a channel layer 17 sandwiched between a confinement layer 16 and a pre-barrier layer 18. The confinement layer 16 has an energy bandgap larger than that of the channel layer 17, and serves as an energy barrier to the flow of charge carriers out of the bottom of the channel layer 17. Suitable materials for the confinement layer 16 include aluminum antimonide and aluminum arsenide. The confinement layer 16 is formed by epitaxial growth such as chemical beam epitaxy, which is one form of molecular beam epitaxy, and ranges from approximately 100 to approximately 1000 angstroms in thickness. Thus, the confinement layer 16 is an epitaxial layer.

Figure 4:
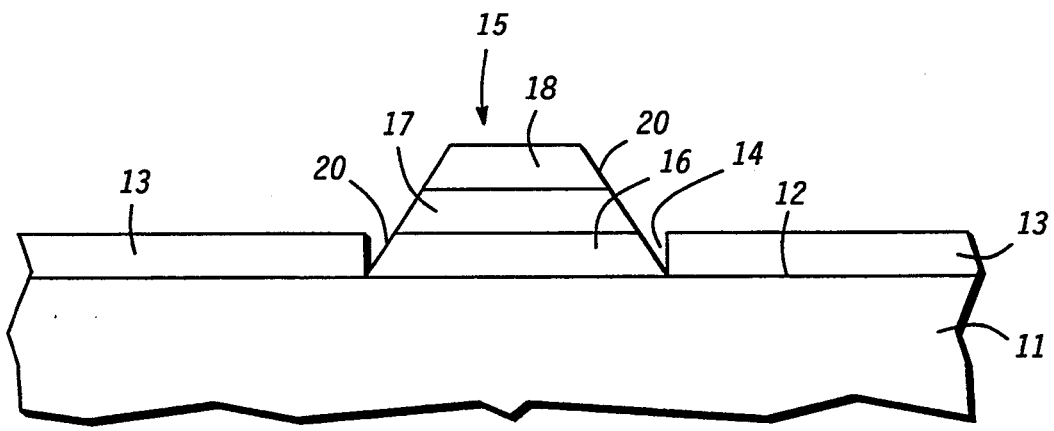

The channel layer 17 provides a conductive region where charge carriers are transported during device operation and may be, for example, indium arsenide or gallium antimonide. The channel layer 17 is formed by epitaxial growth such as chemical beam epitaxy, and ranges from approximately 50 to approximately 150 angstroms in thickness. Thus, the channel layer 17 is an epitaxial layer. The pre-barrier layer 18 is preferably aluminum antimonide having a thickness ranging from approximately 50 to approximately 100 angstroms, and serves as a protective cap for the channel layer 17 during the next processing step as well as eventually forming part of the barrier layer 19. It is well known in the art that chemical beam epitaxy can provide selective growth because the reactants used do not nucleate on insulating layers such as oxides. The side walls 20 of the conductive region 15 are shown in FIG. 4 to not be vertical since it is known to those skilled in the art that in selective epitaxial growth, various crystallographic planes can form due to different growth rates that are orientation and process dependent.

Figure 5:
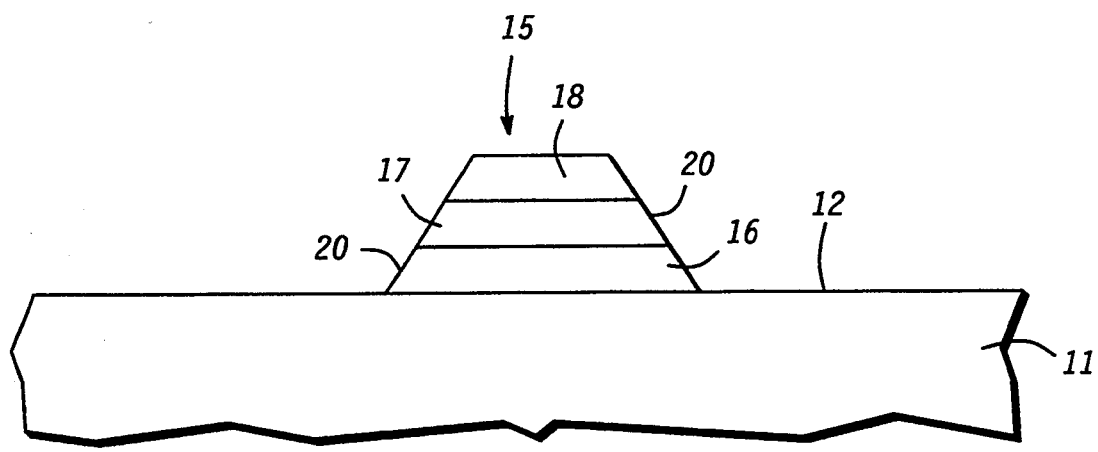

Now referring to FIG. 5, the patterned layer of insulating material 13 (shown in FIG. 4) is selectively removed from the major surface 12. In one embodiment, this is accomplished inside the first chamber by heating the substrate 11 to approximately 600° C. with an overpressure of antimony to protect the exposed surfaces. Since the layer of insulating material 13 is integral with the substrate 11, heating the substrate 11 also heats the layer of insulating material 13. By not needing to carry out this step in a manner that involves exposure to air, as is typically done in conventional. processing, contaminaton which will adversely affect the remaining process is eliminated.

Figure 6:
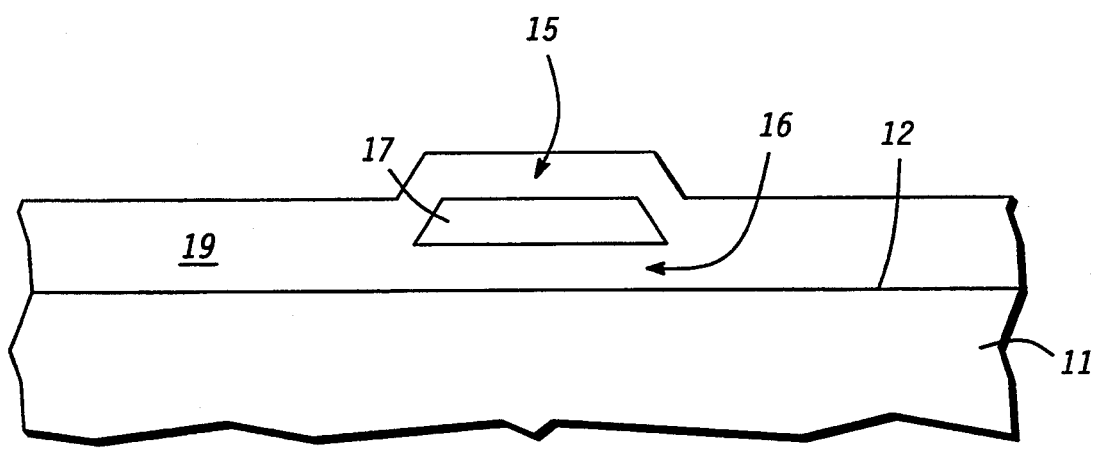

Now referring to FIG. 6, the barrier layer 19 is formed on the exposed portion of the major surface 12 and on the pre-barrier layer 18. In other words, the conductive region 15 is buried under the barrier layer 19. The barrier layer 19 is preferably an aluminum antimonide layer formed by epitaxial growth using such techniques as chemical beam epitaxy, and ranges from approximately 200 to approximately 1250 angstroms in thickness in the region over the exposed portion of the major surface 12. The thickness of the barrier layer 19 is set in accordance with the total thickness of conductive region 15, i.e., the thickness of the barrier layer 19 is comparable to the thickness of the conductive region 15. It is known to those skilled in the art that in epitaxial over-growth on top of a raised feature as shown in FIG. 5, the over-growing layer typically reproduces the planarity of the underlying surface with the actual shape being dependent on the exact crystallographic planes exposed as well as the dimensions of the raised feature.

Figure 7:
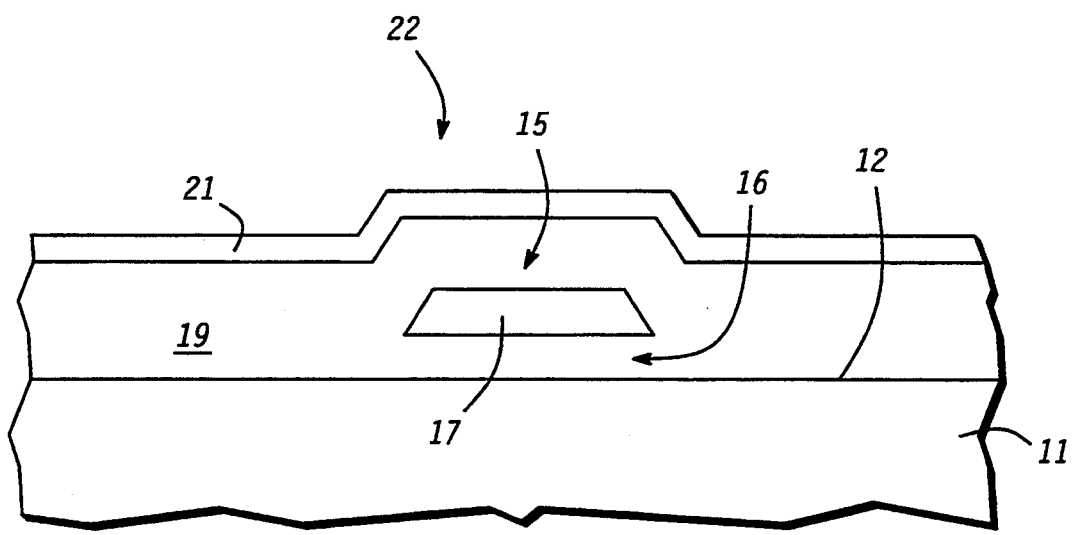

Now referring to FIG. 7, a channel layer 21 formed over the barrier layer 19 is illustrated. The channel layer 21 provides a conductive or channel region where charge carriers are transported during device operation and may be, for example, gallium antimonide or indium arsenide. The channel layer 21 is formed by epitaxial growth using, for example, chemical beam epitaxy, and ranges from approximately 50 to approximately 150 angstroms in thickness.

Figure 8:
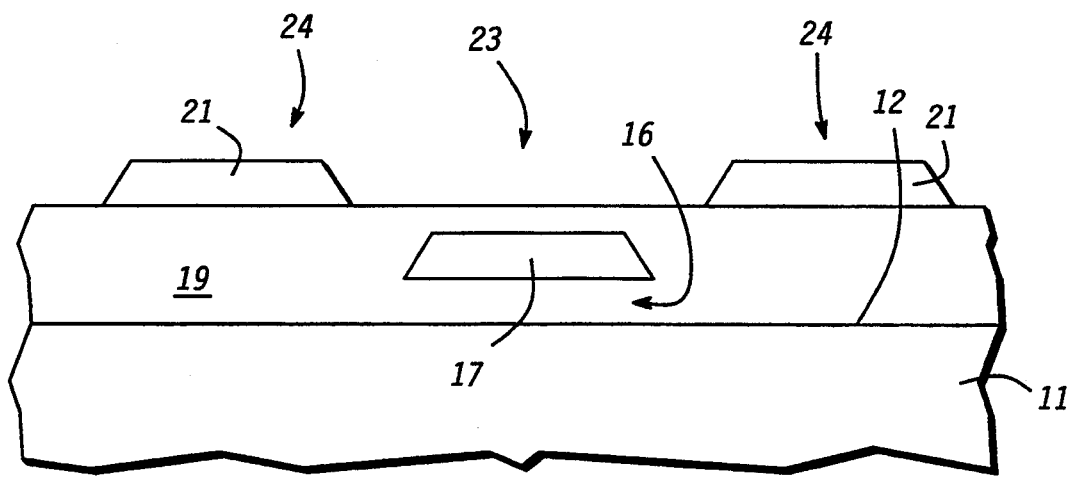

Now referring to FIG. 8, openings 23 are formed in the channel layer 21, wherein the openings 23 are formed by removing a portion of the channel layer 21 and a portion of the barrier layer 19. Portions 24 of the channel layer 21 are adjacent the openings 23. The openings 23 are formed in the patterning/etch chamber using lithographic and etching methods. One approach for doing so is to first form an insulating layer over the channel layer 21. The insulating layer may be similar to insulating layer 13 used earlier in the process. The insulating layer is then patterned to expose the region to be etched. A portion of the channel layer 21 is then etched away. The raised shape of portions 24 provide alignment aids in subsequent processing steps. The patterning process could be repeated to etch away a portion of the barrier layer 19. It shall be understood that any remaining portions of the insulating layer can be removed by heating in the growth chamber as described earlier, resulting in the structure as shown in FIG. 8.

Figure 9:
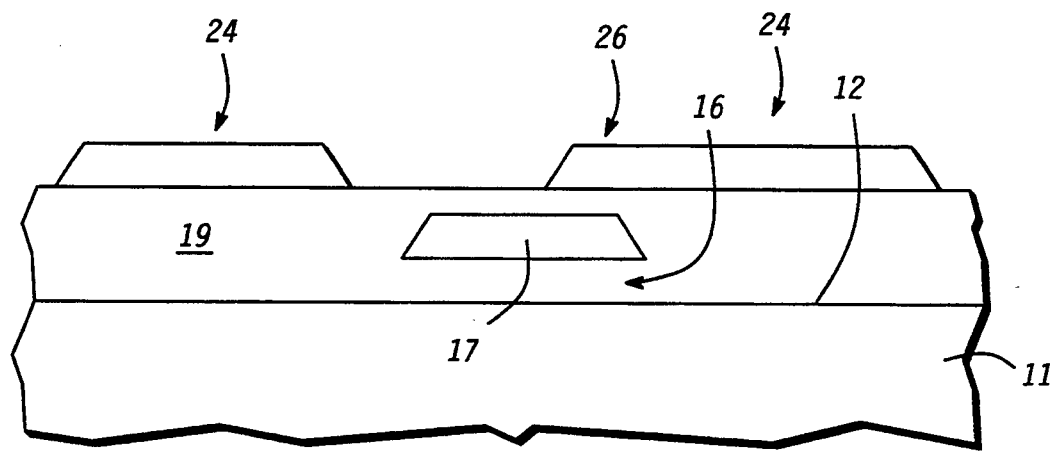

Now referring to FIG. 9, the portions 24 of the channel layer 21 are laterally extended such that a portion 26 overlaps the channel layer 17. Although only the portions 24 are discussed with reference to the lateral extension, it shall be understood that any remaining portions of the channel layer 21 are extended. It is known to those skilled in the art that with certain combinations of crystallographic planes for the side wall and base region in patterned substrates, and by controlling epitaxial growth conditions such as reactant over-pressure, growth will proceed only in the lateral directions. In the case of gallium arsenide, for example, the combination of a <122> type side wall and a <111> B base surface will give rise to lateral growth for a distance of 1 to 10 μm in a direction parallel to the <111> B base surface. Such anisotropy is caused by different atomic bonding characteristics on specific crystallographic planes and is influenced further by reactant over-pressure. It shall be understood that the appropriate side wall orientations are formed when portions of the channel layer 21 are etched.

Figure 10:
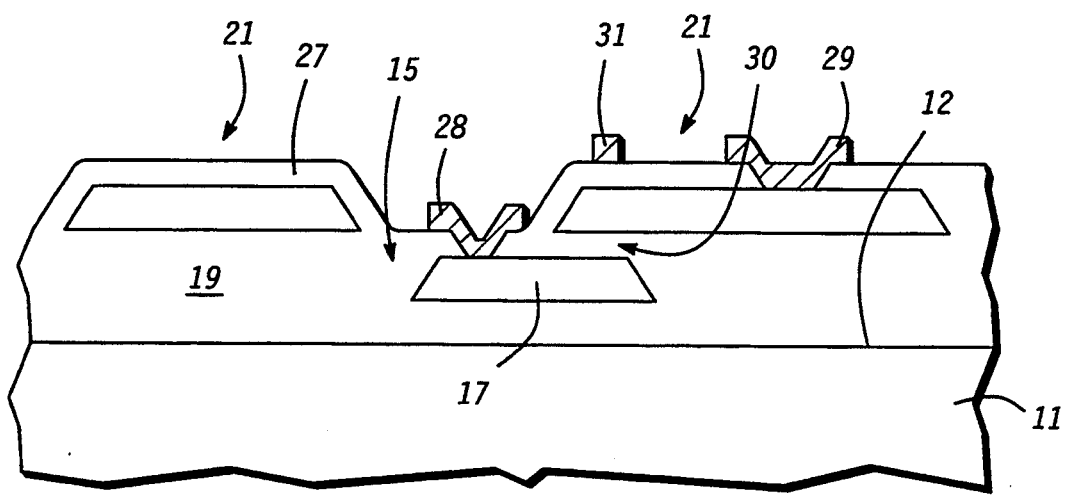

Now referring to FIG. 10, a top barrier layer 27 is formed over the channel layer 21 and the conductive region 15. The top barrier layer 27 is preferably aluminum antimonide and is formed by epitaxial growth, and ranges from approximately 200 to approximately 500 angstroms in thickness.

Still referring to FIG. 10, a source electrode 28, a drain electrode 29, and a gate electrode 31 are shown. The electrodes 28, 29, and 31 are formed using means well known to those skilled in the art. The source electrode 28 contacts the channel layer 17. The drain electrode 29 contacts the channel layer 21. The gate electrode 31 is formed on a region of the top barrier layer 27 under which the channel layer 21 overlaps the channel layer 17. In other words, the gate electrode 31 is formed above the region 30, wherein the region 30 is that region in which the channel layer 21 overlaps the channel layer 17. All the electrodes could be formed using electron beam evaporation. An example of the materials used for the source electrode 28 and the drain electrode 29 is a combination of layers of nickel, gold, and germanium. An example of the materials used for the gate electrode 31 is a combination of layers of titanium and aluminum.

By now it should be appreciated that a method of fabricating a quantum multi-function device has been provided. The method includes using a multi-chamber growth and process apparatus that precisely controls the processing environment, thereby minimizing contaminant deposition on the semiconductor substrate during the various process steps. One advantage of this method is that exposure to air in between processing steps is minimized in order to reduce contamination to the semiconductor surfaces.

I claim:

1. A method of forming a quantum multi-function semiconductor device, comprising the steps of:
   providing a semiconductor substrate having an insulating layer disposed thereon, the insulating layer having a first opening;
   forming a channel region on the semiconductor substrate, the channel region being in the opening;
   forming a barrier layer over the channel region;
   forming a channel layer on the barrier layer;
   forming a second opening, the second opening over the channel region and extending through the channel layer, wherein a portion of the channel layer remains over the channel region; and
   contacting the first channel region with a first electrode and contacting the channel layer with a second electrode.

2. A method of forming a quantum multi-function semiconductor device as claimed in claim 1, wherein the step of forming a channel region includes removing a portion of the insulating layer.

3. A method of forming a quantum multi-function semiconductor device as claimed in claim 2, wherein the insulating layer is removed by heating the insulating layer.

4. A method of forming a quantum multi-function semiconductor device as claimed in claim 1, wherein the step of forming a channel region comprises selectively growing an epitaxial layer on the semiconductor substrate.

5. A method of forming a quantum multi-function semiconductor device as claimed in claim 4, wherein the epitaxial layer comprises first, second, and third layers.

6. A method of forming a quantum multi-function semiconductor device as claimed in claim 5, wherein the first layer comprises aluminum antimonide, the second layer comprises one of indium arsenide or gallium antimonide, and the third layer comprises aluminum antimonide.

7. A method of forming a quantum multi-function semiconductor device as claimed in claim 1, wherein the step of forming a second opening comprises;
   removing a portion of the channel layer that is over the first channel region; and
   laterally growing the channel layer.

8. A method of fabricating a semiconductor device, comprising the steps of:
   providing a semiconductor substrate having a major surface;
   forming a layer of insulating material on the major surface, the layer of insulating material having a first opening exposing a portion of the major surface;
   selectively forming a conductive region in the first opening;
   selectively removing the layer of insulating material;
   forming a first barrier layer on the first conductive region;
   forming a conductive layer over the first barrier layer;
   forming a second opening in the conductive layer, the second opening exposing the first barrier layer;
   laterally extending the conductive layer to overlap the conductive region;
   forming a second barrier layer over the conductive region and the conductive layer; and
   forming a first electrode, the first electrode contacting a portion of the conductive region.

9. A method of fabricating a semiconductor device as claimed in claim 8, wherein the conductive region includes a layer comprising one of indium arsenide or gallium antimonide disposed on a layer of aluminum antimonide.

10. A method of fabricating a semiconductor device as claimed in claim 8, wherein the conductive region includes a layer comprising one of indium arsenide or gallium antimonide disposed on the semiconductor substrate.

11. A method of fabricating a semiconductor device as claimed in claim 8, wherein the conductive region comprises a layer comprising one of indium arsenide or gallium antimonide sandwiched between two layers of aluminum antimonide.

12. A method of fabricating a semiconductor device as claimed in claim 8, wherein the first barrier comprises a layer of a first material disposed on a layer of a second material.

13. A method of fabricating a semiconductor device as claimed in claim 8, wherein the conductive region comprises a layer of a material selected from the group consisting of group III-V compounds and group II-VI compounds.

14. A method of fabricating a semiconductor device as claimed in claim 8, wherein the conductive layer includes a layer comprising one of gallium antimonide or indium arsenide.

15. A method of fabricating a semiconductor device as claimed in claim 8, wherein layer of insulating material is an amorphous material.

16. A method of fabricating a semiconductor device as claimed in claim 8, wherein the electrode further comprises a second electrode contacting the conductive layer, and a third electrode contacting the second barrier layer.

17. A method of processing a semiconductor substrate, the method reducing contaminant deposition on the semiconductor substrate, comprising the steps of:
   providing a multi-chamber growth and processing apparatus having first and second chambers;
   providing a semiconductor substrate having an insulating material disposed thereon and an opening exposing a portion of the semiconductor substrate;

placing the semiconductor substrate in the first chamber of the multi-chamber growth and processing apparatus;

growing a carrier channel region in the opening;

removing a portion of the insulating material, wherein the semiconductor substrate remains in the multi-chamber growth and processing apparatus;

growing a first barrier layer on the first carrier channel region;

growing a carrier channel layer on the first barrier layer;

moving the semiconductor substrate from the first chamber into the second chamber;

removing a portion of the carrier channel layer and a portion of the first barrier layer;

moving the semiconductor substrate into the first chamber;

laterally growing the carrier channel layer to overlap the carrier channel region; and growing a second barrier layer on the carrier channel layer.

18. A method of processing a semiconductor substrate as claimed in claim 17, wherein the step of removing a portion of the insulating material includes heating the insulating material.

19. A method of processing a semiconductor substrate as claimed in claim 17, further comprising contacting the channel carrier region with a first electrode, contacting the carrier channel layer with a second electrode, and contacting the second barrier layer with a third electrode.

20. A method of processing a semiconductor substrate as claimed in claim 17, wherein the carrier channel region and the carrier channel layer comprise one of indium arsenide or gallium antimonide, and the first and second barrier layers comprise aluminum antinomide.

* * * * *